(12) United States Patent
De Pauw et al.

(10) Patent No.: US 6,548,327 B2
(45) Date of Patent: Apr. 15, 2003

(54) LOW COST ELECTROLESS PLATING PROCESS FOR SINGLE CHIPS AND WAFER PARTS AND PRODUCTS OBTAINED THEREOF

(75) Inventors: Herbert De Pauw, Ghent (BE); Jan Vanfleteren, Gent-Brugge (BE); Suixin Zhang, Toronto (CA)

(73) Assignees: Interuniversitair Microelektronica Centrum, vzw, Leuven (BE); Universiteit Gent, Ghent (BE)

( * ) Notice: Subject to any disclaimer, the term of this patent is extended or adjusted under 35 U.S.C. 154(b) by 0 days.

(21) Appl. No.: 09/841,359

(22) Filed: Apr. 24, 2001

(65) Prior Publication Data

US 2002/0001670 A1 Jan. 3, 2002

Related U.S. Application Data

(60) Provisional application No. 60/199,421, filed on Apr. 24, 2000.

(51) Int. Cl.[7] .............................................. H01L 21/44
(52) U.S. Cl. ...................................................... 438/118
(58) Field of Search ................................ 438/106, 118, 438/119

(56) References Cited

U.S. PATENT DOCUMENTS 6,002,180 A * 12/1999 Akram et al. ............... 257/783
6,165,885 A * 12/2000 Gaynes et al. ............... 438/612
6,319,751 B1 * 11/2001 Lin ............................. 438/108
6,329,228 B1 * 12/2001 Terashima ................... 438/156

OTHER PUBLICATIONS

Strandjord et al., "Low Cost Wafer Bumping Processes for Flip Chip Applications (Electroless Nickel–Gold/Stencil Printing)," *IMAPS '99, Chicago*, www.icinterconnect.com/imaps99.htm.

S. Jittinorasett et al., "UBM Formation on Single Die/Dice for Flip Chip Applications," *1999 International Symposium on Microelectronics* sponsored by International Microelectronics And Packaging Society, Oct. 26–28, 1999, pp. 39–44.

* cited by examiner

*Primary Examiner*—David Nelms
*Assistant Examiner*—Thao P Le
(74) *Attorney, Agent, or Firm*—McDonnell Boehnen Hulbert & Berghoff

(57) ABSTRACT

The present invention is related to a method for electroless plating Nickel/Gold on aluminium bonding pads of single chips or wafer parts. This method result in uniformly plated singulated chips, single dice or wafer parts in a much more simple and cost-effective way. The proposed method comprises the steps of attaching to die or wafer part to a non-conductive adhesive or substrate.

24 Claims, 9 Drawing Sheets

Figure 7a
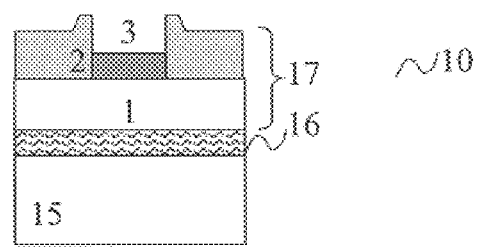
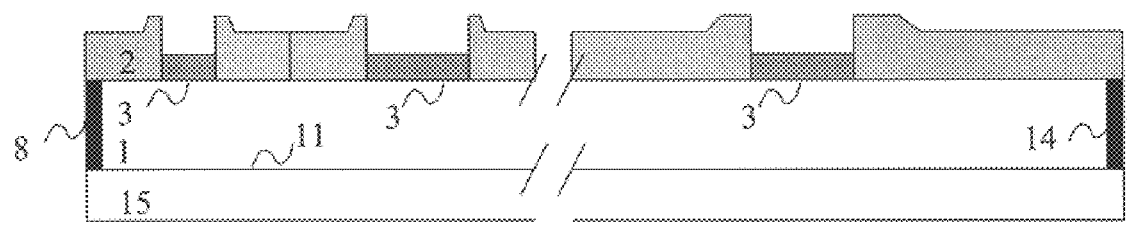
Figure 7b

LOW COST ELECTROLESS PLATING PROCESS FOR SINGLE CHIPS AND WAFER PARTS AND PRODUCTS OBTAINED THEREOF

REFERENCE TO RELATED APPLICATIONS

This application claims priority benefits to the U.S. provisional application No. 60/199,421 filed on Apr. 24, 2000. This application incorporates by reference in its entirety the U.S. provisional application Ser. No. 60/199,421 filed on Apr. 24, 2000.

FIELD OF THE INVENTION

The present invention is related to a method for under-bump-metallisation (UBM) of single chips, dice or wafer parts. The under-bump-metallisation in one aspect is formed by electroless plating of the bonding pads.

BACKGROUND OF THE INVENTION

In the field of semiconductor packaging, the classical approach, which has been used for a long time, is to wire-bond the chip to a lead frame. However, the electrical performance of wire bonded leads can be inadequate, the number of Input/Output (I/O) pads can be too large or there is simply not enough space for wire bonds to be made. As chips gain functionality and their number of Input/Output (I/O) pads increases, integrated circuit manufacturers are therefore searching for alternative ways to package these higher performance devices. Flip Chip technology allows to directly connect the bond pads of the chip with the bond pads of the substrate, board or package. To accomplish this, the chip is flipped to bond the active side, i.e. containing the bond pads of the chip, to the substrate. In flip chip bonding, solder bumps provide connections between the bonding pads of the chip and the bonding pads or metallization present on the substrate or carrier.

Before bonding the chips to the substrate, additional steps are required to modify the top layer, e.g. an aluminium alloy, of the bond pads and/or to add layers to these bond pads as such aluminium alloy top layers can not be soldered or glued. These additional steps comprise the use of e.g. electroless Nickel/immersion Gold (e-Ni/Au) plating as a bond pad-finishing step prior to the flip-chip assembly. The UBM forms an interface between the bonding pads and the solder bumps and provides adhesion, forms a diffusion barrier and offers solder wettable layers. After formation of the UBM, solder bumps can be formed on the bonding pads by various methods, such as electroplating. These additional steps, also known as Under Bump Metallurgy (UBM), form a commercially available process for bonding entire wafers. Wafer-scale UBM processes are commercially available and are offered by companies such as Pac Tech—Packaging Technologies GmbH, Germany, or Picopak Oy, Finland.

However, it often occurs that the entire wafer is unavailable or it is not cost effective to use an entire wafer. It might be that even single chips have to be bumped, particularly in prototyping and small volume applications. In these cases, after finishing or completing the processing of the semiconductor wafer comprising integrated circuits or devices, the wafer is split into parts or singulated into dice or chips. Afterwards, selected dice or chips can be further processed to finally yield a bonded chip. This process of bonding single chips also contains the steps of forming an UBM, creating solder bumps on the bond pads and flip chip connecting the single chip to the substrate or package.

A way to plate bond pads of a single chip currently being applied is to deposit on the edges and on the backside of the chip or wafer part a photoresist layer. This technique is already used for electroless plating of entire wafers in order to form the UBM. In "Low Cost Wafer Bumping Processes for Flip Chip Applications (Electroless Nickel-Gold/Stencil Printing)" by A. Strandjord et al, IMAPS '99, Chicago a method for plating wafer using resist to protect the backside of the wafer is disclosed. The backside of the wafer is covered with a resist layer to avoid plating on this region. Because the area of the backside is large compared to the total area of the bonding pads to be plated, plating the backside would consume a major part of e.g. the Nickel present in the plating solution. This excess and unwanted consumption of Nickel would substantially decrease the lifetime of the plating bath. Furthermore, Nickel grown on the back side of the silicon substrate will adhere poorly to this silicon surface and may be lifted off during subsequent processing. Therefore, one covers the back side of single chips with a resist layer. However, the application of this wafer-scale technique to the formation of UBM on single dice is a manual, time consuming and expensive processing step.

Recently, another method for single chip plating was described by J. Jittinorasett et al in "UBM formation on single Die/Dice for Flip-Chip applications", Proceedings of the $32^{nd}$ International Symposium on Microelectronics, Chicago, Oct. 26–28, 1999, pp. 39–44. The authors emphasise the importance of proper handling of the chips. The authors apply a quite complicated and critical procedure to deposit the UBM, comprising multiple etching and deposition steps in order to solve the non-homogeneous character and the roughness of the electroless deposited Nickel layer. The authors also apply a complicated way of material handling, comprising the steps of bonding the dies onto a temporary substrate by means of an amorphous thermoplastic adhesive. A thermoplastic adhesive is an adhesive which becomes softer as temperature increases regardless how many times they are exposed to heat. This bonding step includes the step of executing a thermocompression cycle and requires high temperatures and a holding force to obtain a bond that withstands the plating process. The release of the plated chip further requires additional heating steps. Finally, time-consuming cleaning steps were required to remove after debonding all residues of the amorphous thermoplastic adhesive on the backside. So, no successful attempts to plate single chips or wafer parts in a low cost way were reported.

AIMS OF THE INVENTION

An aim of the invention is to offer a method for forming under-bump-metallurgy on all bonding pads of a single chip, die or wafer part. These bonding pads include the bonding pads connected with the ground plane or small bond pads.

An additional aim of the present invention is to offer a method to uniform plate bonding pads on singulated chips, single dice or wafer parts in a much more simple and cost-effective way.

Another aim of the present invention is to offer a method to apply commercially available electroless plating procedures to uniformally plate bonding pads on singulated chips, single dice or wafer parts in a much more simple and cost-effective way.

Yet another aim of the present invention is to simplify and to ease the handling of the singulated chips, single dice or wafer parts during the formation of the UBM. Preferably the formation of the UBM is done by electroless plating.

Still another aim of the present invention is to offer a simple and cost-effective method to substantial uniformly plate bonding pads of a single chip and to avoid plating on a major part of this single chip.

SUMMARY OF THE INVENTION

In a first aspect of the invention, a method to uniformly plate all dimensions of bond pads in case of singulated chips, single dice or wafer parts, is presented. The method comprises the steps of providing a carrier and an adhesive, attaching the individual chip to a carrier (the step of attaching consisting of contacting the adhesive with at least a portion of the individual chip) and electroless plating the bond pads of said individual chip. In this manner, the attaching of the carrier need not be performed by applying heat, etc. In one embodiment, at least a portion of the wafer is attached via a non-conductive substrate or glue layer. Moreover, in one embodiment of the invention, this glue layer is a pressure-sensitive adhesive. This pressure-sensitive adhesive has a cure or melt temperature above the process temperature of the plating bath. This cure or melt temperature is preferably higher than 100° C. In a preferred embodiment, Nitto™ tape is used to attach the single die to the temporary carrier.

In another embodiment of the invention, the plating bath used is an electroless plating bath. This electroless plating bath is a self-catalytic plating bath. In a preferred embodiment a Nickel plating bath is used to form the UBM.

In another embodiment the non-conductive substrate has a cure or melt temperature above the process temperature of the plating bath. Preferably this cure or melt temperature is higher than 100° C. In a preferred embodiment a polyamide carrier is used as non-conductive substrate.

In another aspect of the invention, a method for electroless plating at least two chips is disclosed. The method comprising the steps of attaching the chips to a carrier, electroless plating the bond pads of the chips, and dicing to separate the chips. The method allows for the use of the same carrier for both the steps of electroless plating the bond pads and dicing. In one embodiment, the electroless plating is performed prior to the dicing. In an alternate embodiment, the dicing is performed prior to the elecroless plating. Moreover, in one embodiment, the at least two chips comprise a wafer, the step of attaching includes attaching the carrier to the wafer, and the step of dicing includes dicing the wafer. Further, the step of attaching in this aspect of the invention consists of contacting the adhesive with at least a portion of the individual chip. The method may further comprise the step of detaching the individual chip from the carrier. The method may further comprise the step of forming an insulating layer at least to a bottom surface of the wafer, this step of forming an insulating layer at least to the bottom surface of the wafer comprising the step of gluing the wafer to a non-conductive carrier using a pressure-sensitive adhesive.

DESCRIPTION OF THE DRAWINGS

Exemplary embodiments of the invention and of the use of the invention are shown in the drawings. The drawings are schematic representations of the invention and therefore the dimensions and the relative dimensions do not correspond to actual reductions to practice of the invention.

FIGS. 7a–b are schematic cross sections of a single die (FIG. 7a) or a multiple of dies on a wafer (FIG. 7b) according to embodiments of the invention.

DETAILED DESCRIPTION OF THE INVENTION

For the purpose of teaching of the invention, preferred embodiments of the method are described in the sequel. Features of the embodiments of the different aspects of the invention can be also combined. It will however be apparent to the person skilled in the art that other alternative and equivalent embodiments of the invention can be conceived and reduced to practice without departing from the true spirit of the invention.

Figure 1A:
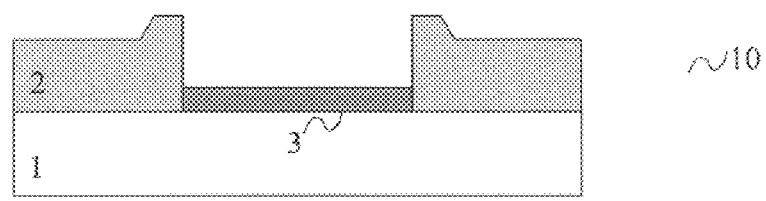
FIGS. 1a–c are an overview of sequence of e-Ni/Au plating on Al bond pads, by cross-sectional views through a bonding pad, with FIG. 1a showing the cross-section after cleaning and prior the plating step, FIG. 1b showing the cross-section during zincate treatment, and FIG. 1c showing the cross-section after plating step.
Figure 1B:
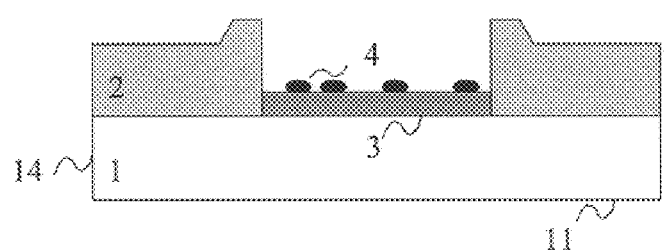

A commercially available electroless Nickel/Gold plating process consists of the following steps (see FIGS. 1a–c):

cleaning of the Aluminium (Al) alloy surface 3, thereby removing the native Al-oxide. This step is also called Al cleaner or Al microetch. (See FIG. 1a). Typically a solution of NaOH is used to remove about 70 nm to yield oxide free surfaces.

rinsing in De Ionised water (DI-water) to remove excess chemicals.

converting the Al surface into a zincate surface 4, applying a zincate bath (See FIG. 1b). The Al layer is partially etched, during this step. The thus formed zinc layer prevents the Al surface from re-oxidation.

rinsing in DI-wafer, to avoid harmful zincate drag-in.

electroless nickel deposition 5, applying a nickel bath.

rinsing in DI-water.

immersion of gold: coating a thin layer of gold 6 on the electroless deposited nickel surface 5.

rinsing in DI-water.

Figure 1C:
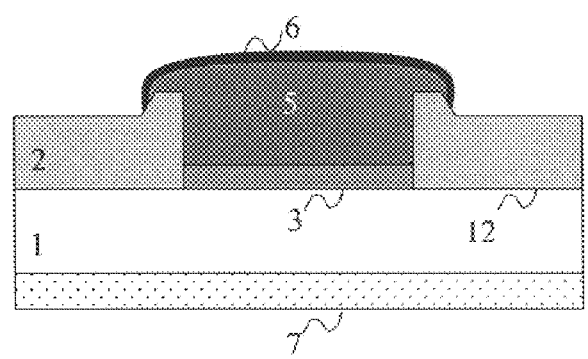

As illustrated in FIG. 1c, only the aluminum or copper bond pad area 3 is plated, possibly with some overlap over the passivation layer adjacent to this bond pad area, while on the passivation layer 2, protecting the electronic circuitry formed on the substrate 1 underneath, no metal is deposited. No depositing of metal on this passivation layer 2 itself is allowed as such metal traces might shortcircuit the various bond pads on the chip. The substrate 1 can be any conducting or semiconducting substrate, for example Si, Ge, $Ga_x$-

Al$_y$As$_z$ (0≦x≦1, 0≦y≦1, 0≦z≦1), GaN, suitable for the manufacturing of electronic circuitry. The circuitry or devices formed on or in the substrate 1, using processes that are common in semiconductor manufacturing technology, are not shown in the figures. Only the substrate 1 and the bonding pads 3 allowing connecting the wiring of such circuitry are shown. At the bottom surface of the wafer 1, a ground plane 7 can be present. This ground plane is a conductive layer, e.g. a metal layer, formed on the bottom surface of the substrate. The bottom surface 11 is the major surface of the substrate, opposite the surface comprising the bond pads, which can be labelled as a first major surface 12. This conductive layer 7 can serve as an electrode for electrically contacting the bulk of the substrate 1, as an electromagnetic shield and/or as a ground plane for transporting or guiding electromagnetic waves as is done in microstrip lines. In the remainder of the text, this ground plane will not be explicitly mentioned. The back side of the substrate is meant as the bottom surface 12 of the substrate 1 or the bottom surface of this conductive layer 7, if present.

Figure 2:
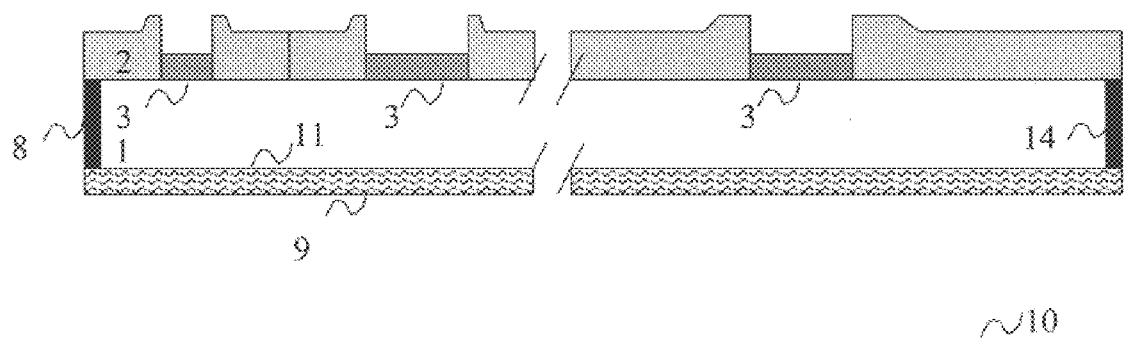
FIG. 2 is cross-sectional view of an entire wafer 1 prior the plating step, comprising electronic circuitry.
Figure 3:
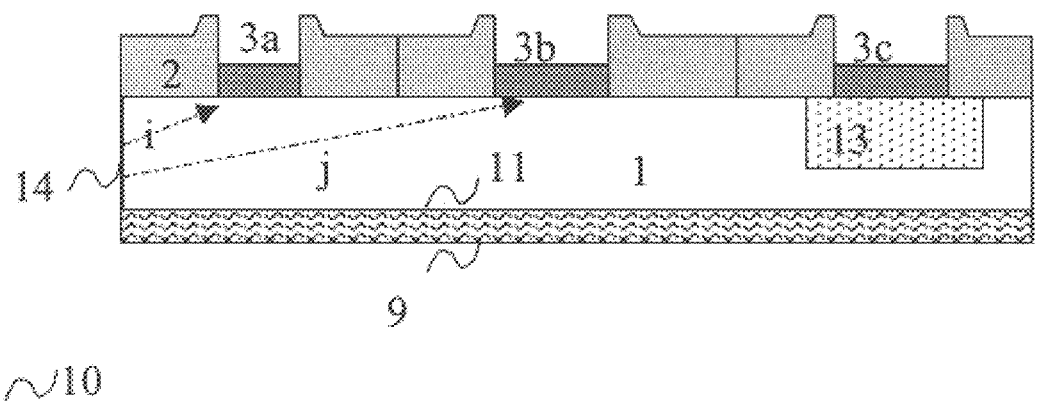
FIG. 3 is a schematic cross-section of a single die.

When applying such a commercially available process of electroless Nickel/Gold plating to plate the bond pads of entire semiconductor wafers, these wafers have all edges, i.e. backside 11 and bevels or side edges 14, electrically isolated from the plating bath (see FIG. 2). After finishing the processing of the electronic circuitry formed in or on the semiconductor substrate 1, the edges of the wafer are isolated, typically by layers 8 e.g. chemical vapour deposited (CVD) oxides, formed on the wafer surface during the process of creating the electronic circuitry. The backside 11 of the (semi)conducting substrate 1 can also be covered with an electrically insulating layer 9. The as-processed wafer will however be thinned prior to the formation of the UBM. A 6 inch wafer having an initial thickness of about 650 micrometer can be thinned to a thickness of 300 micrometer or less depending on the packaging or application requirements. This thinning step will remove at least all electrically insulating layers that might be present on the backside of wafer. But by applying the resist layer 9 in order to prevent unwanted plating on the backside, an additional effect of this resist layer is that backside also becomes electrically insulated from the plating bath. If the wafer is split into parts or singulated into dice, all the edges, i.e. backside and bevel, of the chips now consist of bare, low resistive silicon (Si) in case of a silicon wafer. In this case the commercially available electroless Nickel/Gold plating processes as produced e.g. by leaRonal (Shipley) or NI-865 (Enthome-OMI) does not yield uniform plating heights on all bond pads. Typically the bond pads, connected with the ground plane or substrate, which extends to the edges of the chip, show lower plating heights or no plating at all. This non-uniform plating may be caused by an electrical interaction between the substrate 1 and the plating solution 10 because the non-insulated substrate is no longer at a floating potential. This electrical interaction can be the exchange of charge carriers at the surface of the substrate 1. These charge carriers might travel to the bonding pads where they interact with the plating process. This electrical interaction can be due to a change in the electrical potential of the substrate that will be communicated through conductive paths from the substrate to the bonding pads. The lower the resistive path between the plating bath 10/substrate 1 interface and the bonding pad area's 3, the more likely the plating process on the bonding pads will be influenced. To overcome this problem, at least a substantial part of the substrate should be electrically insulated. FIG. 3 is a schematic cross-section of a single die. The back side 11 of this p-doped silicon substrate 1 is covered with a resist layer 9. The bevels 14 of the conducting substrate are not covered and are exposed to the plating solution. On the front side of the substrate, only the bond pads 3 are not covered by the passivation layer 2. In this example, one bond pad 3c is formed in an n-doped region 13 e.g. an n-well, which is electrically isolated from the p-type substrate 1. Between the bond pad 3a in direct electrical contact with the substrate 1 and the bevel 14, a lower resistive path i exists. Element i is shown in FIG. 3 as an arrow between bevel 14 and bond pad 3a. This bond pad 3a is likely to show no or a lower plating height compared to bond pad 3c. Bond pad 3b in direct electrical contact with the substrate 1, but is located away from the bevel resulting in a higher resistive path j between the bond pad surface and the interface between the conductive substrate and the plating bath. This bond pad 3b is expected to show a larger plating height compared to bonding pad 3a.

In the standard approach of depositing a resist layer, at least on the backside of the wafer is applied, the singulated substrate is electrically isolated from the plating bath. Hence, a uniform plating of all bonding pads can be obtained. This process, however, is a very labor intensive and expensive one. As shown above, another attempt to solve this problem of non-uniform plating was by modifying the plating sequence, leading to a more complex and defect-prone process.

Therefore, one aspect of the present invention discloses a method to obtain a substantially uniform plating thickness on bond pads connected with the semiconductor substrate or ground plane. The proposed method does not require additional steps to shield the edges or the backside of the dice or wafer parts, nor does it require complex or high temperature steps to bond the dice or wafer parts to a carrier. The present invention eases and reduces the bonding and debonding of the chips in a cost-effective way. The present invention does not lead to any additional contamination of the plating bath when immersing carrier, adhesive and dice in the different plating baths used.

Figure 4A:
FIGS. 4a–d are schematic representations of a process sequence of attaching a singulated chip 3 or a plurality of singulated chips onto a insulating substrate 1, using a pressure-sensitive adhesive 2 according to one embodiment of the invention.
Figure 4B:
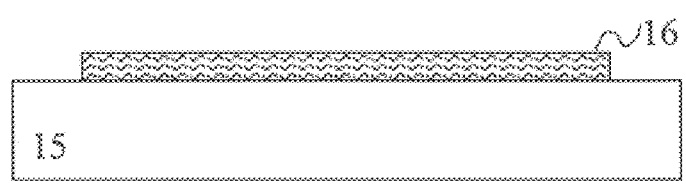
Figure 4C:
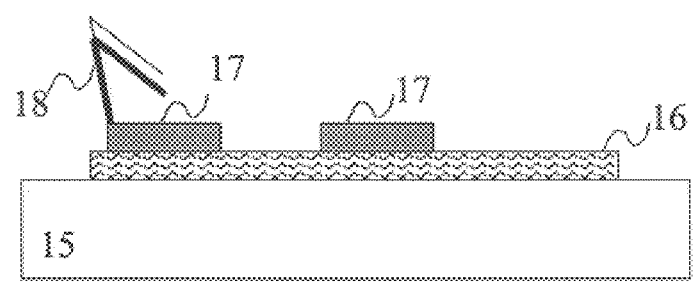
Figure 4D:
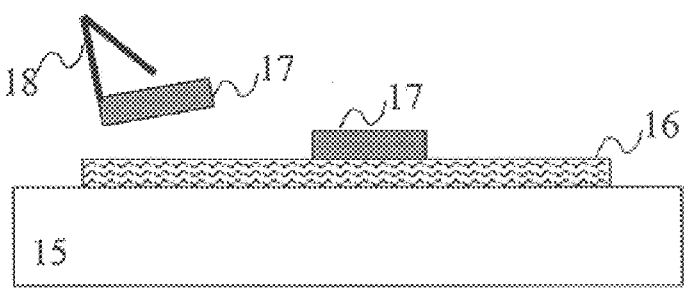

In a first aspect of the present invention the chips, dice or wafer parts are attached to an insulating carrier. The process of plating wafer parts comprises the step of attaching the wafer part or parts to an electrically insulating carrier by means of an adhesive. This attachment process comprises the steps of (FIGS. 4a–d):

providing an insulating carrier or substrate 15 (FIG. 4a).
  applying a layer of an adhesive 16 onto this carrier 15 (FIG. 4b).
  attaching the single chips or wafer parts 17 to this adhesive 16 (FIG. 4c).

The bonded chip or wafer part (see FIG. 4) is now ready for executing the steps of the commercially available electroless plating processes, e.g. Nickel or Copper, as explained above. Generally, electroless plating can be described as follows: an electroless bumping or plating bath is a liquid in which, on localised parts of an immersed substrate, conductive material present in this liquid is being deposited without external supply of charge carriers. The localised parts of the immersed substrate 1 are the metallic bonding pads 3 exposed to the liquid. The conductive material is in one embodiment a metal, e.g. Nickel, Copper. In an alternative embodiment, alternative conductive material may be used. The pH range of such electroless plating bath extend from 2 to 12. The plating temperature of such plating baths is typically above 70 Celsius, normally about 90 Celsius.

Because the wafer part or single chip is now bonded onto a non-conductive or insulating carrier, the bond pads connected to the ground/substrate will therefore be plated. This non-conductive carrier will avoid interference of the nickel deposition process. As shown in FIG. 4, one can attach several chips or wafer parts to this non-conductive substrate and plate simultaneously several single chips. After the completion of the plating process, the individual dies will be removed from the carrier in a simple way. (See FIG. 4d). The chip can now be flip-chip bonded to an appropriate board.

In a preferred embodiment of this first aspect, the process of plating single chips or wafer parts comprises the steps of:
attaching by means of a tweezer or vacuum pincet the single chips or wafer parts 17 to a tape 15 covered with a pressure-sensitive adhesive 16.
executing the commercially available plating process.
detaching the single chips from the tape. One method of detachment is by means of, for example, a tweezer or vacuum pincet.

In one embodiment, the carrier 15 and adhesive 16 used is a commercially available Nitto™ film normally used in the process of the dicing wafers. In an alternate embodiment, the carrier 15 and the adhesive 16 may be purchased as separate devices and not be composed of a single device, such as the Nitto™ film.

As discussed above, the removable carrier 15 used can be a commercially available film, e.g. from Nitto Corp. Japan, for example tape VD-8 or VD-15 (8 and 150 micron respectively), which is normally used as a temporary support in the process of the dicing wafers. The Nitto™ film is covered with a removable pressure-sensitive adhesive and will be described in the following as "Nitto tape." Removable pressure sensitive adhesives which predictably adhere, yet remain peelable from a variety of substrates without damaging the substrate or leaving any adhesive residue on the surface, are described in the literature. They are often provided as a sheet material which may be unsupported or supported by a typically flexible backing such as, for example, polyester, biaxially-oriented polyethylene terephthalate film, pvc, or other suitable polymeric films. Ideally, depending on the substrate, the removable pressure sensitive adhesive must provide a quick initial adhesion build-up (sufficient initial tack or quick stick) to quickly fix the adhesive to the desired substrate. On the other hand, the adhesive should exhibit only a low and at any rate an acceptable adhesion build-up with time, even at elevated temperatures, to ensure clean peelability after prolonged dwell times. The adhesive should furthermore be characterised by an adequate peel strength to give a reliable adhesion to the substrate without damaging on the other hand the substrate when removing the adhesive. On removal the adhesive should fail in adhesion to the semiconductor substrate, i.e., leaving a residue-free surface.

Another requirement is a sufficient cohesive strength and hence form stability of the adhesive coated sheet to allow a proper handling. The cohesive strength is adjusted to the thickness of the adhesive layer and must be the higher the thicker the adhesive layer in order to avoid cohesive failure on peeling off the tape. A sufficient cohesive strength is also required in order to limit the cold flow of the adhesive on a surface, a process which can lead to an undesirable building-up of peel strength over time. The static shear strength should be high enough to allow the light-duty mounting applications of the present invention without being too high to result in permanent adhesion. The cohesive strength, the shear strength and the peel adhesion are interrelated and they are mainly influenced by the cross-linking density, the loading with filler and the thickness of the adhesive layer. Other examples of tapes are those made by Advanced Research Corp., USA, tapes ARclad® 7992, 8901, 8471 and those supplied by Permacel Corp. USA, e.g. P-377, P-366, P335 or P925.

The Nitto™ film is covered with a pressure-sensitive adhesive. Pressure-sensitive is a term used to designate a category of adhesive tapes which in dry (solvent free) form are aggressive and permanently tacky at room temperature and adhere to a variety of surfaces. In one aspect, a pressure sensitive adhesive bonds without the need of more than finger or hand pressure. In particular, the adhesive bonds only by contacting the adhesive with at least a portion of the individual chip. They require no activation by water, solvent or heat and have sufficient cohesive strength so they can be handled with the fingers. Pressure-sensitive adhesives measure of performance is expressed in ounces, pounds or metric per inch width as it is pulled at a 180 degree angle at the rate of 12 inches per minute usually off a polished stainless steel panel.

In a conventional dicing process the wafer is attached to the Nitto™ tape, sawn into individual chips that can be individually removed from the tape by a vacuum pincet. Such films are not expected to withstand chemical processing as these tapes are only used in the mechanical process of dicing wafers. In a preferred embodiment of the invention the single dice or chips are attached to a more rigid polyamide carrier, using an adhesive tape. This adhesive tape can be a commercial available tape as is being used when dicing wafers, such as the above mentioned Nitto™ tape. This dicing tape, used in our plating experiments, unexpectedly did not contaminate any of the different baths involved in electroless nickel plating and could withstand the process temperatures. After plating or bumping the chips were removed from the tape by using a vacuum pincet. Suitable removable pressure sensitive adhesives for use with the present invention should furthermore exhibit a high resistance to water and plating solutions.

The following companies sell tapes, normally used in the bonding and assembly process, using pressure-sensitive adhesives. Moreover, some of the products offered by the companies are rated for the following: Peel Adhesion—the force required to remove a pressure sensitive adhesive tape from a standard test panel at a specified angle and speed under specified conditions. Usually expressed in ounces per inch width. Adhesive Residue—Following tape removal, an adhesive deposit left behind on a substrate to which the tape was attached. Removable Adhesive—A pressure-sensitive adhesive characterized by low ultimate adhesion to a wide variety of surfaces.

Adhesives Research, Inc.
400 Seaks Run Road
Glen Rock, Pa. 17327

Product: ARclad® 7992
Caliper: 5 mils (0.13 mm)
Adhesive: Permanent Acrylic, double-sided
Carrier: Clear Polyester Film
Release Liner: Double-Faced 84# polycoated Kraft
Temp Performance: Long Term: 150° F. (66° C.); Short Term: 300° F. (149° C.)
Peel Adhesion: 30 oz./in.

Product: ARclad® 8901
Caliper: 8 mils (0.20 mm)
Adhesive: Permanent Acrylic, double-sided
Carrier: Black Polyester Film
Release Liner: 60# double-faced Kraft
Service Temp Range: 50° F. (10° C.) to 250° F. (121° C.)
Peel Adhesion: SS-50 oz./in.; 24 hr./SS-70 oz./in.

Product: ARclad® 8471

Caliper: 34 mils (0.86 mm)
Adhesive: Permanent Acrylic, double-sided
Carrier: 1/32" Black Closed Cell Polyethylene Foam
Release Liner: 74# double-faced Kraft
Service Temp Range: 50° F. (10° C.) to 175° F. (80° C.)
Peel Adhesion: 60 oz./in.

Permacel, A Nitto Denko Company
U.S. Highway No. 1
P.O. Box 671
New Brunswick, N.J. 08903

Plating Process Permacel® tapes protect circuit boards from splashing and fumes of harsh chemicals during plating process. The specially designed blended silicone/acrylic adhesive provides maximum adhesion with no leakers and easy tape removal with no residue.

Figure 5:
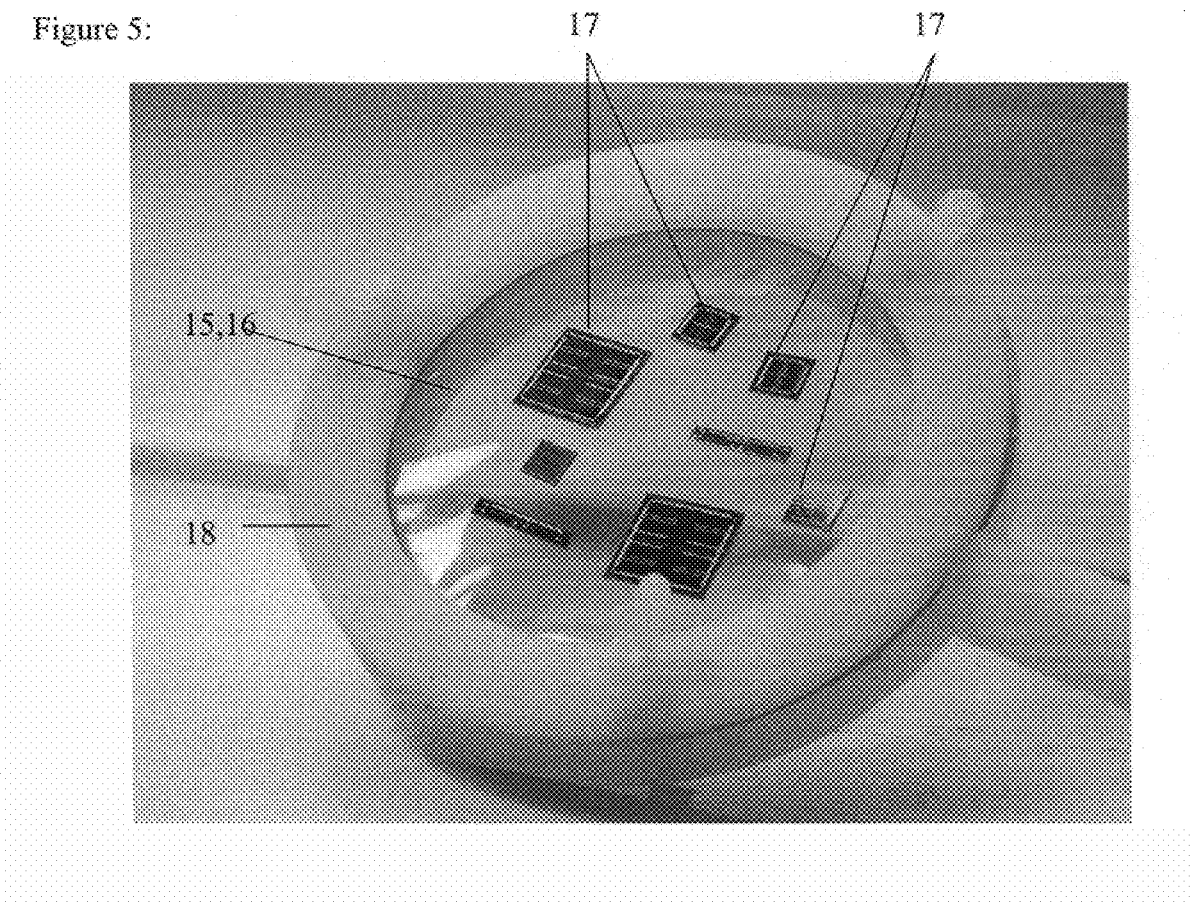
FIG. 5 is an illustration of a preferred embodiment, showing dies 17 attached to a Nitto™ tape 15.
Figure 6:
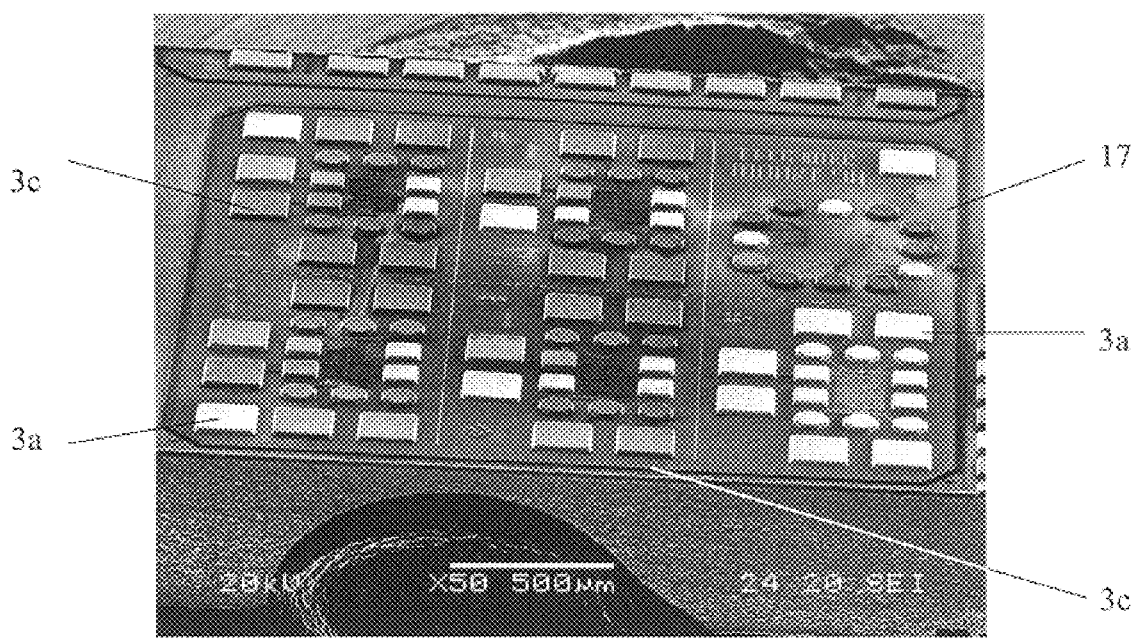
FIG. 6 is an SEM picture of an individual plated die according to a preferred embodiment showing similar plating thickness obtained on insulated 3c and non-insulated 3a bond pads.

P-377 Red Polyester Plating Tape
P-366 Blue Polyester Plating Tape
P-335 PVC Fume Tape
P-925 Gold Anchorage Testing Tape FIG. 5 illustrates a picture of a preferred embodiment. Several dies 17 are glued to a Nitto™ tape 15 mounted in a rigid polyamide holder or frame 18. The handling of the dies is made very easy by using such holder. The holder will be put into the plating solutions. FIG. 6 is a SEM (Scanning Electron Microscope) picture showing the uniform plating resulting from the handling of the dies according to the present invention. All bond pads of the plated die 17 show substantially the same plating height. The bond pads 3a in electrical connection with the substrate are white, while the insulated bond pads 3c are dark as a result from the SEM operation.

Figures 8A, 8B, 8C:
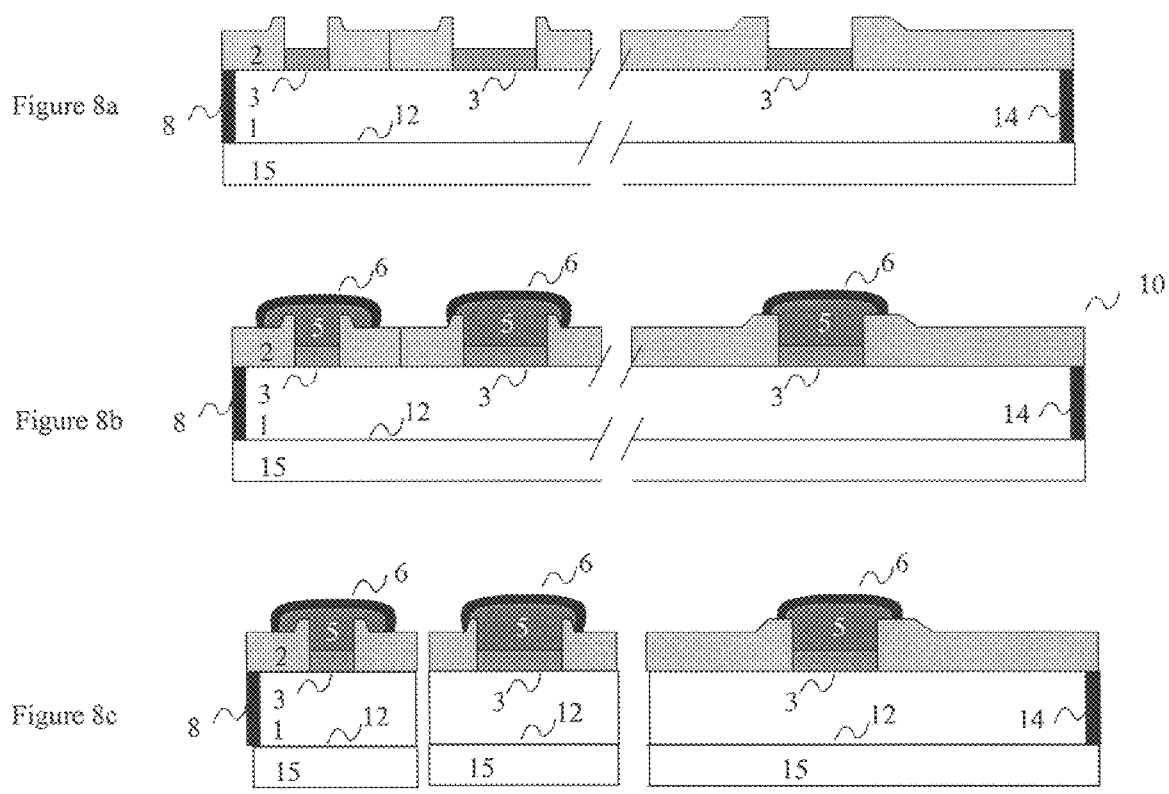
FIGS. 8a–c are schematic cross sections of a process of plating (FIG. 8b) and dicing (FIG. 8c) a fill wafer according to embodiments of the invention.

A second aspect of the invention is related to the type of carrier used. The carrier 15 supporting the die 17 should be at least as large as the bottom surface 11 of the die, as illustrated in FIG. 7a. The step of attaching the die to an insulating substrate can be executed at wafer level. An insulating layer is then formed on or attached to the bottom surface and/or the side edges of the wafer before dicing the wafer. This layer can be formed for example during a low-temperature Chemical Vapour Deposition process and can comprise non-conductive materials such as oxides or nitrides. This layer can be a resin layer. If, after thinning of the wafer 1, the entire wafer is transferred to a non-conductive substrate (see FIG. 7b) the stack of wafer and non-conductive substrate can be diced into individual dies or wafer parts, similar to the die shown in FIG. 5a. The wafer can be bonded to the carrier e.g. by glueing or other wafer-bonding techniques known in the art. This singulated die already has an electrically insulated bottom layer and can be attached to every type of carrier, insulating or non-insulating for subsequent plating. FIGS. 8 and 9 illustrate sequences in order to plate and dice a complete wafer according to one embodiment of the invention. A full wafer is provided after thinning. The thinned wafer can be attached to a film or tape, e.g. a Nitto™ tape, as is used in the dicing or sawing of wafer in to single chips or wafer parts (see FIG. 8a). The thinned wafer contacted to this non-conductive carrier 15 can be plated, e.g. with Nickel 5 and Gold 6 because the non-conductive carrier or element protects the plating on the bottom surface 12 of the wafer and prevents non-uniform plating on the bond pads in contact with the conductive substrate (FIG. 8b). The bonding between the non-conductive carrier 15 and the substrate 1 is preferably be done by a pressure-adhesive sensitive 16, not shown in FIGS. 8a–c. After plating the wafer contacted to the carrier can be cleaned and transferred to the step of dicing the wafers. If a Nitto™ tape or other tapes used for holding wafer during the dicing step, is used to protect the bottom surface 12 of the wafer 1 during the plating process, the same tape or film can be used and hence remain on the wafer during the dicing process (see FIG. 8c). After dicing the plated wafer into single chips the non-conductive film or carrier can be removed.

Figure 9A:
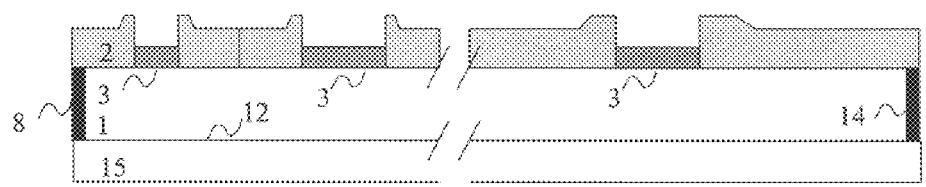
FIGS. 9a–c are schematic cross sections of a process of dicing (FIG. 9b) and plating (FIG. 9c) a full wafer according to embodiments of the invention.
Figure 9B:
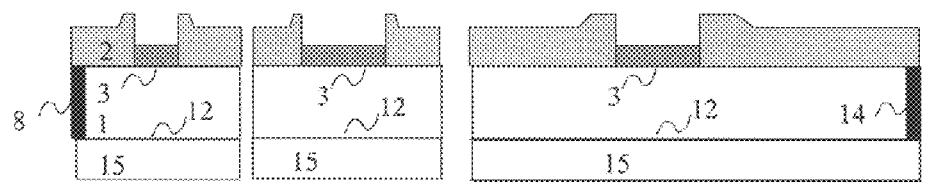
Figure 9C:
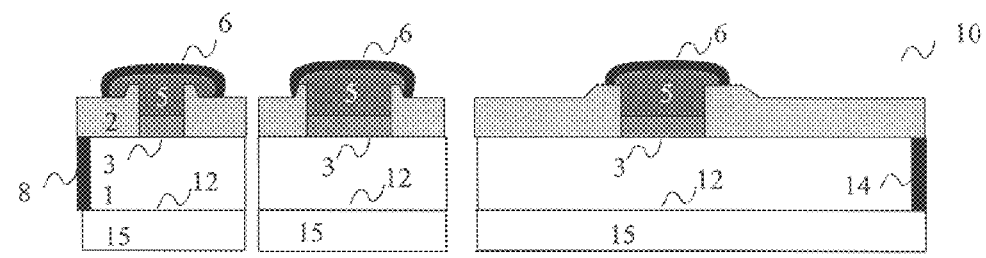

In another sequence illustrated in FIGS. 9a–c, the thinned wafer 1 is placed on the dicing tape 15 (FIG. 9a) and diced into individual chips (FIG. 9b). After dicing the tape remains on the individual chips and forms a protective layer on the bottom surface during the plating 10 of the single chip (FIG. 9c). After the plating the tape can be removed from the bottom surface of the single chip.

In first embodiment of the second aspect of the invention, the type of carriers is limited to non-conductive carriers having a cure or melt temperature above 100° C. or at least slightly above the process temperature of the plating bath, in order to avoid degradation of the carrier. This temperature limitation avoids contamination of the plating bath by dissolution of the carrier components, compounds or fractions thereof at elevated temperatures. It is known that plating baths, e.g. electroless nickel baths, are sensitive to contaminants. The carrier must remain intact or unaffected by the plating solution at the plating conditions, e.g. composition, pH or process temperature. The carrier must keep its integrity.

In a second embodiment of the second aspect of the invention, the non-conductive substrate has a volume resistivity of at least 10 MOhm.cm and a surface resistivity of at least 1 Mohm. The substrate can be rigid or a flexible. Examples of suitable substrates are FR4, Alumina substrates, glass substrates, Kapton flex, polyamide substrates, ceramic substrates, printed-board-circuit (PCB) substrates.

A third aspect of the invention is related to attachment of the die to the carrier. Removable pressure sensitive adhesives which predictably adhere, yet remain peelable from a variety of substrates without damaging the substrate or leaving any adhesive residue on the surface, are described in the literature. Ideally, depending on the substrate, the removable pressure sensitive adhesive must provide a quick initial adhesion build-up (sufficient initial tack or quick stick) to quickly fix the adhesive to the desired substrate. On the other hand, the adhesive should exhibit only a low and at any rate acceptable adhesion build-up with time, even at elevated temperatures, to ensure clean peelability after prolonged dwell times. The adhesive should furthermore be characterised by an adequate peel strength to give a reliable adhesion to the substrate without damaging on the other hand the substrate when removing the adhesive.

Another requirement is a sufficient cohesive strength and hence form stability of an adhesive coated sheet to allow a proper handling. The cohesive strength is adjusted to the thickness of the adhesive layer and must be the higher the thicker the adhesive layer in order to avoid cohesive failure on peeling. A sufficient cohesive strength is also required in order to limit the cold flow of the adhesive on a surface, a process which can lead to an undesirable building-up of peel strength over time. The static shear strength should be high enough to allow the light-duty mounting applications of the present invention without being too high to result in permanent adhesion. The cohesive strength, the shear strength and the peel adhesion are interrelated and they are mainly influenced by the crosslinking density, the loading with filler and the thickness of the adhesive layer.

The die is attached to the carrier preferably by a pressure-sensitive adhesive. Pressure sensitive adhesives or tapes are characterised in that in dry, i.e. solvent-free, form they are aggressively and permanently tacky at room temperature and firmly adhere to a variety of dissimilar surfaces upon mere contact without the need of more than finger or hand pressure. They require no activation by water "solvent" or heat to exert a strong adhesive holding force. They have a sufficiently cohesive holding force and elastic nature so that, despite their aggressive tackiness, they can be handled with the fingers and removed from smooth surfaces without leaving a residue. A die, attached to a carrier by a pressure-sensitive adhesive, can be detached or removed from this carrier by a pair of tweezers or a vacuum pincet or other mechanical means. After the removal, the bottom surface of the die can be cleaned by wiping the surface with commercially available solvents such as acetone, isopropyl alcohol.

In a first embodiment of the third aspect, the type of pressure-sensitive adhesives or glues is limited to those having a curing temperature above 100° C. or at least slightly above the process temperature of the plating bath. The process temperature of the plating bath must below the temperature at which the pressure-sensitive adhesive looses its property of tackiness and ease of removing. Otherwise the adhesive might be cured or baked during the plating process. Thus, the cured adhesive would make the detaching of the chip or wafer parts after plating impossible or only at the expense of residues left on the backside of the chip or wafer part. Adhesives having a curing temperature below 100° C. or below the process temperature of the plating bath could contaminate the plating bath.

In a fourth aspect of the invention, the chips or wafer parts are attached on a carrier by means of an insulating adhesive. This adhesive is preferably a pressure-sensitive adhesive. This insulating adhesive will electrically insulate the ground plane 7 or substrate 1 of the wafer part or die 17 from the plating bath 10. The insulating adhesive will at least cover the bottom surface of the die to avoid direct electrical contact between the carrier 15, which in this case can be conductive, and the chip 17. (See FIG. 5e) A disadvantage of this approach is that on the surfaces of a conductive carrier 15 parasitic plating can occur leading to an excess consumption of the plating metal.

In view of the wide variety of embodiments to which the principles of the invention can be applied, it should be understood that the illustrated embodiment is an exemplary embodiment, and should not be taken as limiting the scope of the invention.

The claims should thus not be read as limited to the described order or elements unless stated to that effect. Therefore, all embodiments that come within the scope and spirit of the following claims and equivalent thereto are claimed as the invention.

What is claimed is:

1. A method for electroless plating individual chips with bond pads, the method comprising the steps of:
   providing a carrier and an adhesive;
   attaching the individual chip to a carrier, the step of attaching consisting of contacting the adhesive with at least a portion of the individual chip; and
   electroless plating the bond pads of said individual chip.

2. A method as recited in claim 1, further comprising the step of:
   detaching the individual chip from the carrier.

3. A method as recited in claim 1, wherein a tape includes the carrier and adhesive.

4. A method as recited in claim 2, wherein said chip is formed in or on a conductive substrate.

5. A method as recited in claim 4, wherein said adhesive is a non-conducting adhesive.

6. A method as recited in claim 5, wherein said non-conducting adhesive is a pressure-sensitive adhesive.

7. A method as recited in claim 6, wherein said step of electroless plating the bond pads is performed at a process temperature in a plating bath, and
   wherein said pressure-sensitive adhesive remains operable above the process temperature of the plating bath.

8. A method as recited in claim 7, wherein said pressure-sensitive adhesive remains operable above 100° Celsius.

9. A method as recited in claim 6, wherein said carrier is a non-conductive carrier.

10. A method as recited in claim 9, wherein said carrier has a volume resistivity of at least 10 MOhm.cm and a surface resistivity of at least 1 Mohm.

11. A method as recited in claim 10, wherein said step of electroless plating the bond pads is performed at a process temperature in a plating bath, and
    wherein said carrier maintains its integrity at the process temperature of the plating bath.

12. A method as recited in claim 11, wherein said carrier maintains its integrity at temperatures above 100° Celsius.

13. A method as recited in claim 12, wherein said carrier is selected from the group of FR-substrates, glass substrate, PCB substrates, polyamide substrates, and ceramic substrates.

14. A method as recited in claim 11, wherein said carrier is selected from the group of FR-substrates, glass substrate, PCB substrates, polyamide substrates, and ceramic substrates.

15. A method as recited in claim 6, wherein said electroless plating process is an electroless nickel plating process.

16. Devices produced from the methods of claim 2.

17. A method for electroless plating at least two chips, the chips having bond pads, the method comprising the steps of:
    attaching the chips to a carrier;
    electroless plating the bond pads of the chips; and
    dicing to separate the chips,
    wherein the steps of electroless plating the bond pads and dicing are performed with the same carrier.

18. A method as recited in claim 17, wherein the chips comprise a wafer,
    wherein the step of attaching includes attaching the carrier to the wafer, and
    wherein the step of dicing includes dicing the wafer.

19. A method as recited in claim 17, wherein the step of electroless plating of the bond pads is performed before the step of dicing the wafer.

20. A method as recited in claim 17, wherein the step of dicing the wafer is performed before the step of electroless plating of the bond pads.

21. A method as recited in claim 17, wherein the step of attaching consists of contacting the adhesive with at least a portion of the individual chip.

22. A method as recited in claim 17, further comprising the step of:
    detaching the individual chip from the carrier.

23. A method as recited in claim 17, further comprising the step of forming an insulating layer at least to a bottom surface of the wafer.

24. A method as recited in claim 23, wherein said step of forming an insulating layer at least to the bottom surface of the wafer comprises the step of gluing the wafer to a non-conductive carrier using a pressure-sensitive adhesive.

* * * * *